US007723992B2

(12) United States Patent
Schmitkons et al.

(10) Patent No.: US 7,723,992 B2
(45) Date of Patent: May 25, 2010

(54) DETECTOR FOR AN ULTRAVIOLET LAMP SYSTEM AND A CORRESPONDING METHOD FOR MONITORING MICROWAVE ENERGY

(75) Inventors: James W. Schmitkons, Lorain, OH (US); Carl A. Bretmersky, North Olmsted, OH (US)

(73) Assignee: Nordson Corporation, Westlake, OH (US)

( * ) Notice: Subject to any disclaimer, the term of this patent is extended or adjusted under 35 U.S.C. 154(b) by 289 days.

(21) Appl. No.: 11/771,085

(22) Filed: Jun. 29, 2007

(65) Prior Publication Data

US 2009/0001990 A1 Jan. 1, 2009

(51) Int. Cl.
*G01R 31/00* (2006.01)
*G01R 11/63* (2006.01)

(52) U.S. Cl. ...................... 324/414; 324/96; 324/103 R

(58) Field of Classification Search ................. 324/414, 324/403, 76.11, 96, 103 R; 315/149, 157, 315/308; 250/250

See application file for complete search history.

(56) References Cited

U.S. PATENT DOCUMENTS 4,324,965 A * 4/1982 Naumann et al. ........... 219/696
4,354,153 A * 10/1982 Lentz .......................... 324/95
5,111,210 A * 5/1992 Morse ........................ 342/455
6,633,170 B2 * 10/2003 Kong et al. ................. 324/637
6,693,382 B2 2/2004 Little et al.
6,952,082 B2 * 10/2005 Schmitkons et al. ........ 315/149

* cited by examiner

*Primary Examiner*—Hoai-An D Nguyen
(74) *Attorney, Agent, or Firm*—Wood, Herron & Evans, L.L.P.

(57) ABSTRACT

A detector for an ultraviolet lamp system of the type having a microwave generator includes a first circuit that is configured to detect the microwave energy generated from the microwave generator. The first circuit includes at least one radiation sensitive component capable of failing upon exposure to an excessive amount of microwave energy. A second circuit is coupled to the first circuit and configured to intermittently test whether the radiation sensitive component has failed. An ultraviolet lamp system includes the detector. An associated method includes monitoring the microwave energy through the first circuit including at least one radiation sensitive component capable of failing upon exposure to an excessive amount of microwave energy and testing the radiation sensitive component to determine whether the radiation sensitive component has failed.

26 Claims, 4 Drawing Sheets

DETECTOR FOR AN ULTRAVIOLET LAMP SYSTEM AND A CORRESPONDING METHOD FOR MONITORING MICROWAVE ENERGY

FIELD OF THE INVENTION

The present invention relates generally to ultraviolet lamp systems and, more particularly, to detection of microwave energy from microwave-excited ultraviolet lamp systems.

BACKGROUND OF THE INVENTION

Ultraviolet (UV) lamp systems are commonly used for heating and curing materials such as adhesives, sealants, inks, and coatings. Certain ultraviolet lamp systems have electrodeless light sources and operate by exciting an electrodeless plasma lamp with microwave energy. In an electrodeless ultraviolet lamp system that relies upon excitation with microwave energy, the electrodeless lamp is mounted within a metallic microwave cavity or chamber. One or more microwave generators, such as magnetrons, are coupled via waveguides with the interior of the microwave chamber. The magnetrons supply microwave energy to initiate and sustain a plasma from a gas mixture enclosed in the electrodeless lamp. The plasma emits a characteristic spectrum of electromagnetic radiation strongly weighted with spectral lines or photons having ultraviolet and infrared wavelengths.

To irradiate a substrate, the ultraviolet light is directed from the microwave chamber through a chamber outlet to an external location. The chamber outlet is capable of blocking emission of microwave energy while allowing ultraviolet light to be transmitted outside the microwave chamber. A fine-meshed metal screen covers the chamber outlet of many conventional ultraviolet lamp systems. The openings in the metal screen transmit the ultraviolet light for irradiating a substrate positioned outside the microwave chamber; yet substantially block the emission of microwave energy.

In order to protect operators of the ultraviolet lamp systems, RF sensing devices are placed between the operator and the lamp. These RF sensing devices are connected to microwave energy detectors, which are set, based on OSHA standards (similar to standards for microwave ovens), to detect microwave energy in excess of a predetermined amount, e.g., about 5 $mW/cm^2$. If microwave energy output levels exceed this amount, the microwave energy detector is configured to shut down the system to limit the exposure of the operator to the microwave energy.

Microwave energy detectors may contain some components that are radiation sensitive. The microwave energy detectors can become damaged and not accurately report excessive microwave energy emissions if one or more of the radiation sensitive components fails. For example, the mesh screens that are used to cover the chamber outlets and block microwave energy are typically made of metals such as tungsten wire and are fairly delicate so they may be easily damaged, allowing microwave energy out of the microwave cavity. In extreme cases, attempts to operate the ultraviolet lamp system may be made with the protective screen removed. In these cases the detector should prevent the operation of the lamp system. However, the detector and supporting circuitry may be damaged by the excess microwave energy and damaged in such a way that the detector allows continued operation of the lamp system as damaged components become open or short circuits.

SUMMARY OF THE INVENTION

The invention provides an ultraviolet lamp system including a microwave energy generator and an electrodeless lamp configured to emit ultraviolet light when excited by microwave energy generated from the microwave energy generator. The ultraviolet lamp system further includes a detector for detecting an excessive amount of microwave energy. The detector includes a first circuit configured to detect microwave energy, where the first circuit includes at least one radiation sensitive component capable of failing upon exposure to the excessive amount of microwave energy. A second circuit is coupled to the first circuit and is configured to intermittently test whether the radiation sensitive component has failed.

The second circuit is configured to supply a known signal to the first circuit to test the radiation sensitive component. The known signal may be an RF signal, a low frequency AC signal, or a DC signal. The second circuit is further configured to temporarily suspend the detection of the microwave energy by the first circuit to test the radiation sensitive component. The second circuit tests the radiation sensitive component by detecting an open or short circuit across the radiation sensitive component, which may be a detector diode or resistor. In some embodiments, the microwave energy generator for the ultraviolet lamp system is a magnetron.

BRIEF DESCRIPTION OF THE DRAWINGS

The accompanying drawings illustrate embodiments of the invention and, together with a general description of the invention given above, and the detailed description given below, serve to explain the principles of the invention.

DETAILED DESCRIPTION

Various embodiments disclosed herein provide a microwave energy detector for an ultraviolet lamp system including a test circuit coupled with a detector circuit. The test circuit is operable to check the integrity of one or more radiation sensitive components in the detector circuit, and to provide additional safeguards to an operator of the ultraviolet lamp system. In some embodiments, the test circuit may suspend the operation of the microwave energy detector to test the radiation sensitive component(s) in the detector circuit by introducing known signals to the detector circuit and comparing the microwave energy detector output against theoretical values based on the known test signals. A test result that indicates failure of the radiation sensitive component(s) may cause the ultraviolet lamp system to shut down, as would a detection of excessive energy from the microwave energy detector. The term circuit in the embodiments is used to refer to both an individual collection of electrical elements forming an electrical circuit and a collection of electrical circuits that perform a particular function.

While radiation sensitive components may fail in various other ways, one failure mechanism for such components relates to the fine mesh screens commonly used to cover the aperture of a UV lamp system. As discussed above, fine mesh screens, typically provided on the front of the ultraviolet lamp, are used to minimize the amount of microwave energy coming from the microwave chamber through the aperture with the electromagnetic radiation (ultraviolet light). The microwave energy is continually monitored by microwave energy detectors as discussed above, which may shut down the microwave energy generator and operation of the lamp if the microwave energy exceeds preset safety levels. It has been found, however, that operation of an ultraviolet lamp system with the fine mesh screen removed or damaged can expose radiation sensitive components in the detector circuit of the microwave energy detector to excessive microwave energy, and cause those components to fail, preventing the detector circuit from reporting excessive output of microwave energy.

Figure 1:
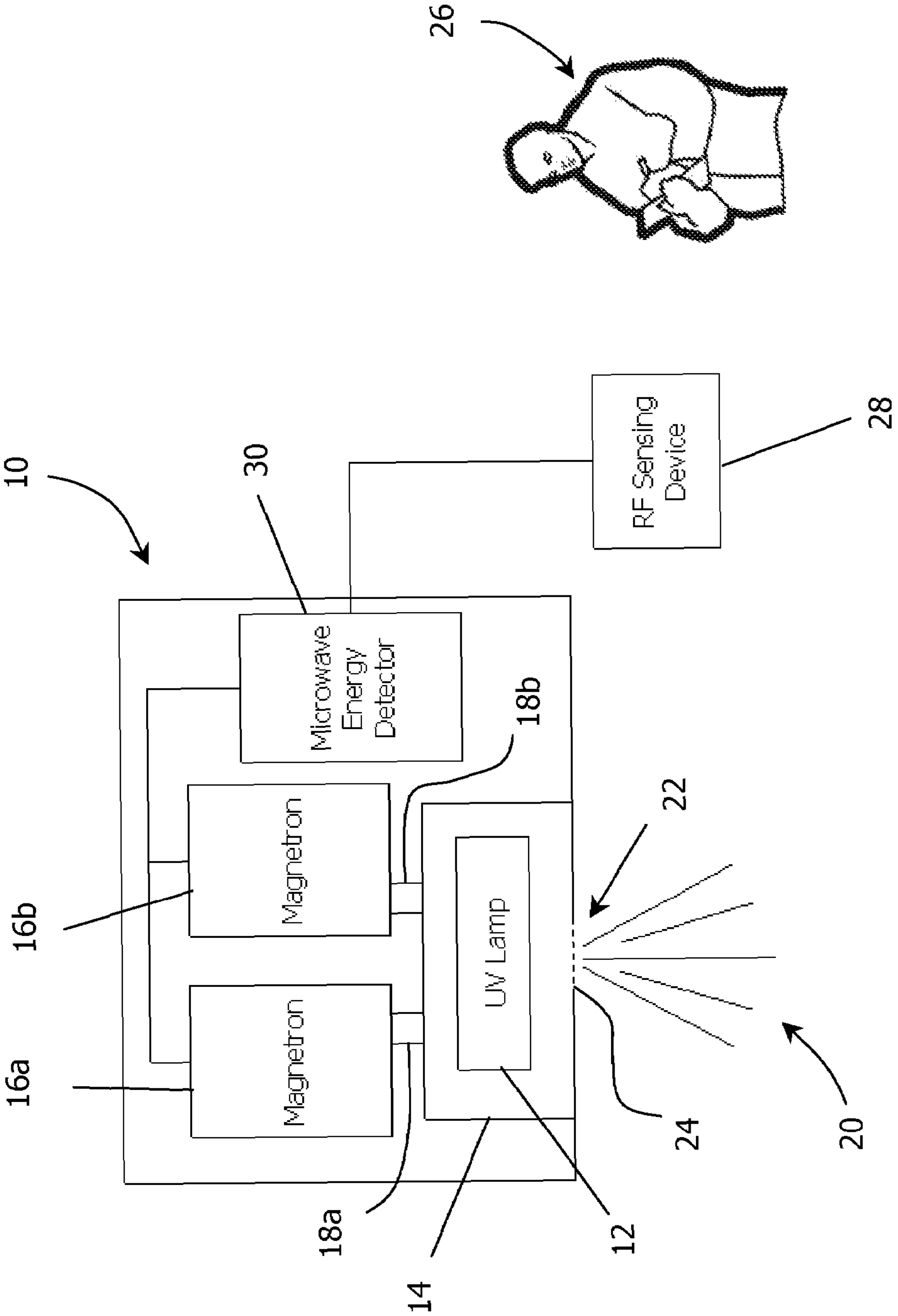
FIG. 1 is a block diagram of an Ultraviolet Lamp System.

Referring now to the drawings where like numbers denote like components among the several views, FIG. 1 is a block diagram of an ultraviolet lamp system 10 that relies upon excitation of an electrodeless lamp 12 with microwave energy. The electrodeless lamp 12 is mounted within a metallic microwave chamber 14. One or more microwave energy generators 16*a*, 16*b*, e.g., magnetrons, are coupled via waveguides 18*a*, 18*b* with the interior of the microwave chamber 14. The microwave energy generators 16*a*, 16*b* supply microwave energy to the electrodeless lamp 12 in order to generate ultraviolet light 20. The ultraviolet light 20 is directed from the microwave chamber 14 through a chamber outlet 22 to an external location through a fine-meshed metal screen 24 which covers the chamber outlet 22 and is capable of blocking emission of microwave energy, while allowing the ultraviolet light 20 to be transmitted outside the microwave chamber 14.

An RF sensing device 28, which is coupled to a microwave energy detector 30, protects operators 26 of the ultraviolet lamp system 10 from exposure to excessive levels of microwave energy. The RF sensing device 28 is placed between the operator 26 and the lamp 10. The microwave energy detector is configured to detect microwave energy in excess of a predetermined amount, e.g., about 5 $mW/cm^2$. If the UV lamp system 10 outputs microwave energy levels exceeding the predetermined amount, the microwave energy detector 30 is configured to directly or indirectly shut down the UV lamp 10 to limit the exposure of the operator 26 to the microwave energy.

Figure 2:
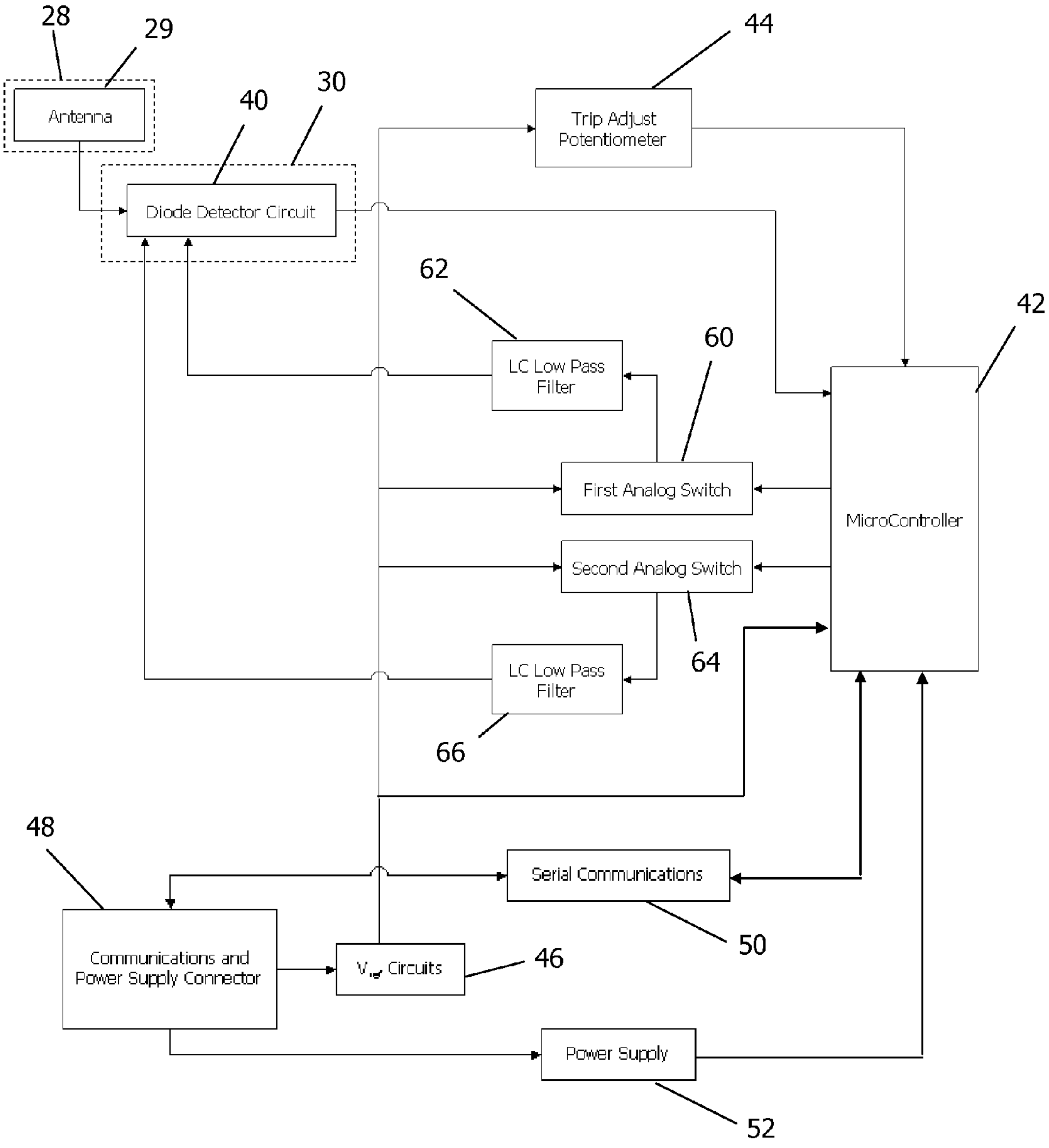
FIG. 2 is a block diagram of an exemplary embodiment of a detector circuit, including a test circuit, for a microwave energy detector in the UV Lamp System of FIG. 1 consistent with the invention.
Figure 3:
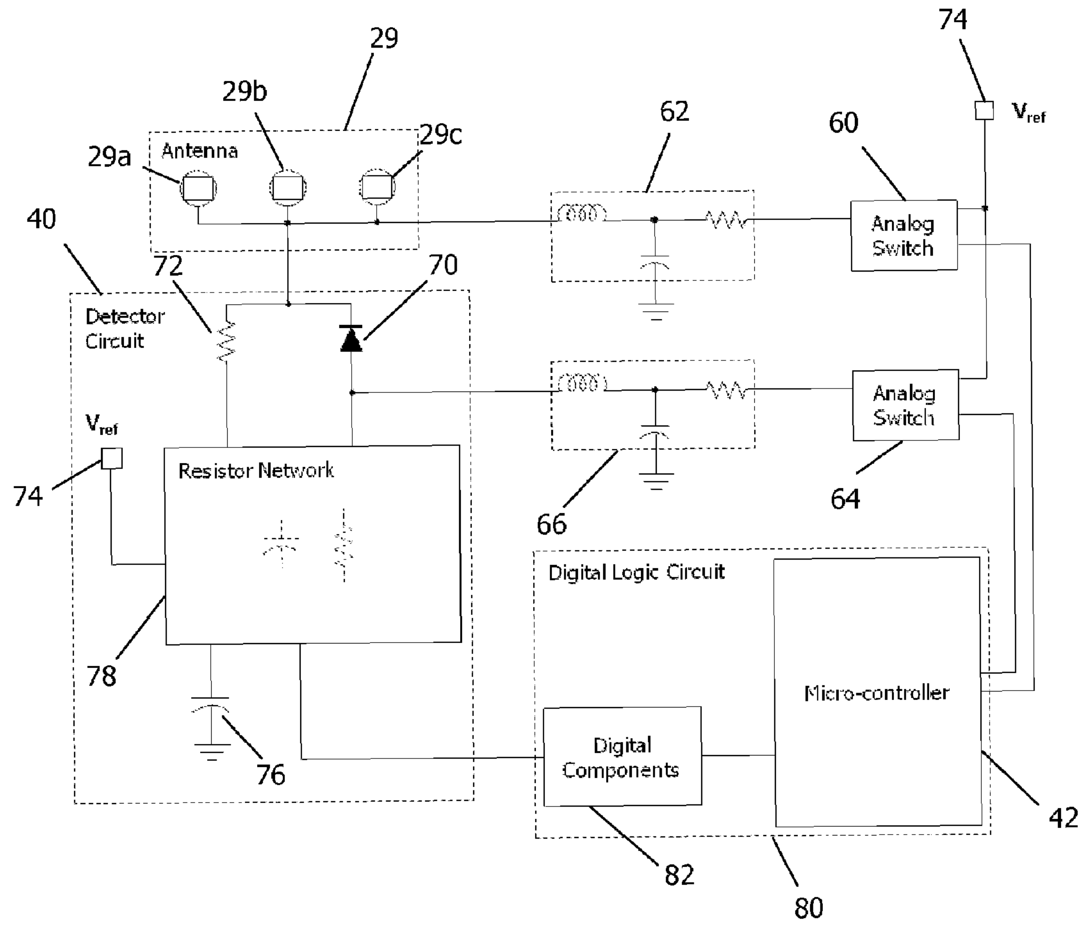
FIG. 3 is a schematic diagram of an exemplary embodiment of the test circuit of FIG. 2.

FIG. 2 is block diagram providing additional detail of an exemplary embodiment of a microwave energy detector 30 having a diode detector circuit 40 with a test circuit 60-66 consistent with the invention. An RF sensing device 28, such as an antenna 29, is placed between the lamp 10 and an operator 26 as a protection measure for the operator 26 as illustrated in FIG. 1. Receptacles 29*a*-29*c* (FIG. 3) of the antenna 29 receive microwave energy generated by a microwave generator 16*a*, 16*b* and radiated from the microwave cavity 14 through the aperture 22. The antenna 29 is electrically connected to a first circuit configured as a diode detector circuit 40, which may contain radiation sensitive components, such as a detector diode 70 (FIG. 3).

The diode detector circuit 40 acts as a comparator circuit, comparing the incoming microwave energy against preset values. Comparison may occur in the diode detector circuit 40 itself or, as an additional example, the detector circuit 40 may be electrically connected to a microcontroller 42, which performs the comparisons between the received microwave energy and the preset values. If the microwave energy exceeds the preset values, the microcontroller 42 may be used in some embodiments to shut down the operation of the UV lamp system 10. Preset comparison values are on the order of 5 $mW/cm^2$, which is based on current microwave oven standards and OSHA requirements. Other embodiments of the detector circuit may have preset values that are based on other standards that differ from those above. In some embodiments, the microcontroller 42 may not directly shut down the UV lamp system 10, but rather set a “Trip” condition that signals other circuitry in the UV lamp system 10 to shut down. Adjusting the trip condition for detection with a trip adjustment potentiometer 44 is part of the initial calibration performed at the manufacturer.

Microwave energy received by the antenna 29 is value shifted so that an input voltage is always being measured by the diode detector circuit 40. In some embodiments, the voltage shift may be approximately 2 volts for a zero energy input. The shift level may be adjusted by the trip adjust potentiometer 44 or by other reference circuits 46.

In some embodiments, the microcontroller 42 communicates with other portions of the UV lamp system 10 such as the circuitry and components labeled communications and power supply connector 48 in FIG. 2. The microcontroller 42 may communicate through serial communications 50, or other types of communications for other embodiments. The communications and power supply connector supplies power 52 to the microcontroller 14 and is responsible for determining and/or setting the reference voltage levels in the reference circuits 46.

To improve the safety of the UV lamp system 10, embodiments include a second circuit, configured as a test circuit 60-66 that tests the integrity of any radiation sensitive components in the diode detector circuit 40. Tests on the components of the diode detector circuit 40 may be conducted intermittently, for example, approximately every 10 to 30 seconds. In other embodiments, tests may be performed more or less frequently. For purposes of this application, intermittent means periodic if the tests are performed at regular intervals, or non-periodic if the intervals between the tests are variable and/or at the discretion of the operator 26. The microcontroller 42 temporarily suspends the detection of microwave energy by the diode detector circuit 40 in order to perform the tests. After suspension of the microwave energy detection, the microcontroller 42 activates a first analog switch 60, which allows a test signal to be passed through a low pass filter 62 to the diode detector circuit 40 in front of the radiation sensitive component(s). If the radiation sensitive component(s) pass the test, the microcontroller 42 then deactivates the first analog switch 60, and activates a second analog switch 64. Again a test signal is passed from the switch 64 through a low pass filter 66 to the diode detector circuit 40 behind the radiation sensitive component(s). If the radiation sensitive components also pass this test, the microcontroller 42 deactivates the second analog switch 64 and restores the operation of microwave energy detection to the diode detector circuit 40. The low pass filters 62, 66 may be used to isolate the test circuit 60-66 from the microwave energy received from the antenna 29.

The radiation sensitive components of the detector circuit 40 may consist of a detector diode 70 and a resistor 72 in parallel as shown in the schematic diagram in FIG. 3. Failure of either of these components from exposure to excessive microwave energy may affect the ability of the diode detector circuit 40 to accurately detect microwave energy levels. During the first test, the microcontroller 42 activates the first analog switch 60, passing a DC reference voltage 74 through the analog switch 60 and the low pass filter 62 to supply a voltage from the antenna 29 to ground at capacitor 76. A voltage measurement may be taken at capacitor 76, which may be higher than the threshold voltage of about 2 volts as discussed above. In other embodiments, a voltage measurement from another part of the diode detector circuit 40 may be taken, e.g. in a resistor network 78. The microwave energy detector may also consist of two sections, the diode detector circuit 40 and a digital logic circuit 80. The section containing the diode detector circuit 40 uses the detector diode 70, in conjunction with the resistor network 78 to provide a voltage that is compared against a reference as discussed above and is currently known in the art. The digital logic circuit 80 includes additional digital components 82 with the microcontroller 42 which communicates with the UV lamp system control and in some embodiments, may be operable to switch between the detection of microwave energy and the detection of test signals.

During the second test, the microcontroller 42 deactivates the first analog switch 60 and activates the second analog switch 64. This allows the reference voltage 74 to be applied behind the diode 70 to ground at capacitor 76. Again, a voltage measurement may be taken at capacitor 76, which may be less than the voltage from the first test because of the voltage drop across the diode. If the diode 70 is shorted, the voltage may be the same. If the diode 70 is an open circuit, the voltage may be even lower, indicating a fault in the diode detection circuit 40. Similar voltage measurements may indicate a failure of the resistor 72. Alternate embodiments of the test circuit 60-66 may only test the voltage across the resistor 72 or the diode 70.

Figure 4:
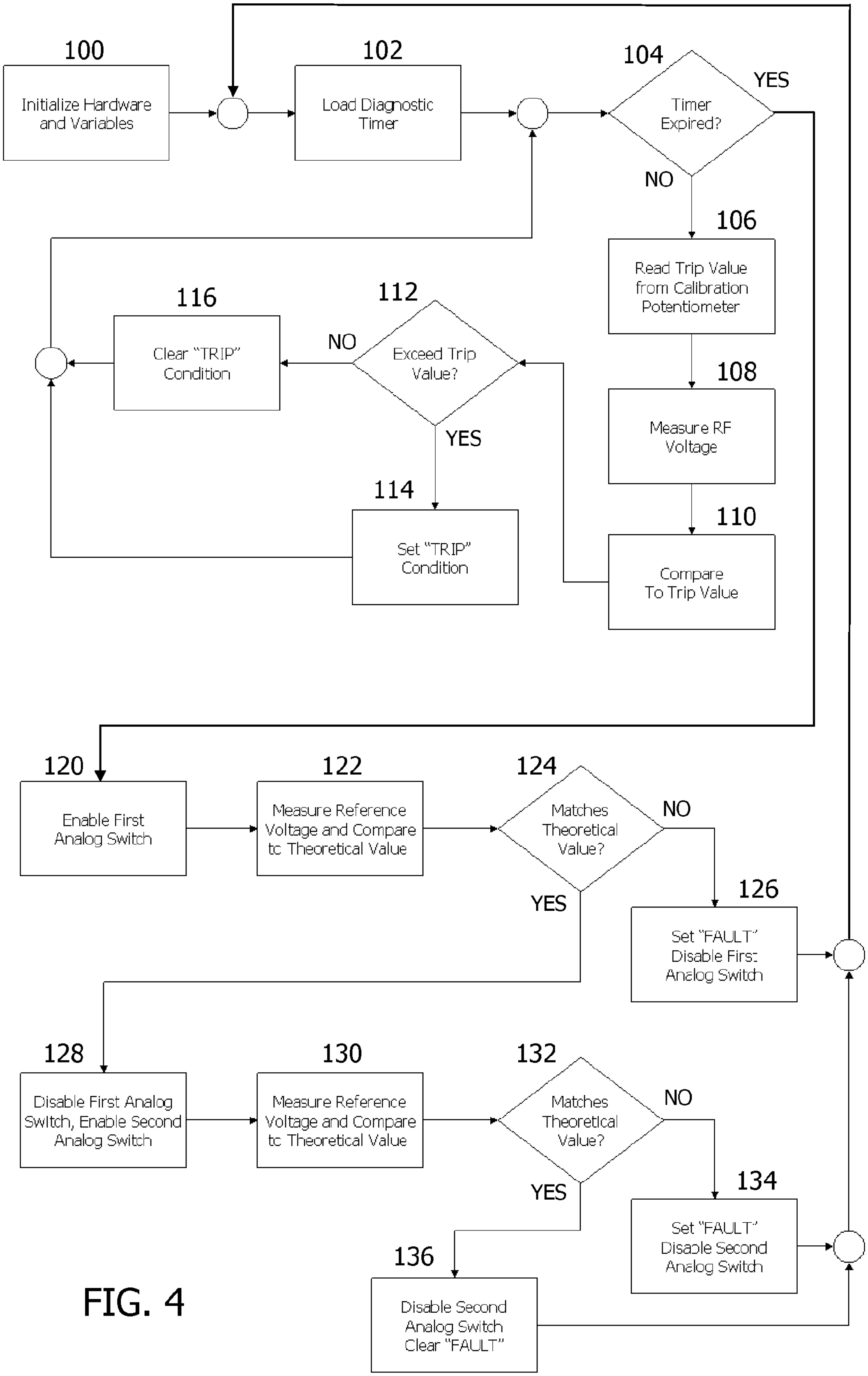
FIG. 4 is a flowchart of an exemplary embodiment of the invention illustrating the test circuit working in conjunction with the detector circuit of the microwave energy detector.

The detection 40 and test 60-66 circuits described above in FIGS. 2 and 3 operate in two testing loops as illustrated in the flowchart of FIG. 4. After the initialization of the microcontroller 42 and other hardware in block 100, a diagnostic timer is loaded with the time periods for testing the diode detector circuit 40 in block 102. If the timer for testing has not expired ("no" branch of decision block 104), the loop for the diode detection circuit 40 executes. The diode detection circuit 40 loop first reads the trip value set from the calibration potentiometer 44 in block 106. The circuit 40 then measures an RF voltage from the microwave energy received on the antenna 29 and processes the RF voltage through the diode detector circuit 40 in block 108. The RF voltage is then compared to the trip value obtained from the calibration potentiometer 44 in block 110. If the measured RF voltage exceeds the trip value ("yes" branch of decision block 112), the microcontroller 42 may set the trip condition in block 114 and then proceed with another detection cycle. As discussed above, other circuitry may then receive the trip signal and shut down the operation of the UV lamp system 10. If the measured RF voltage does not exceed the trip value ("no" branch of decision block 112), the microcontroller 42 will clear the Trip condition in block 116 and proceed with another detection cycle. This series of steps 104-116 continues until the timer for testing has expired ("yes" branch of decision block 104).

When the timer expires, as discussed above, the microcontroller 42 may temporarily suspend the microwave energy detection before testing the diode detector circuit 40. The test begins in block 120 when the microcontroller 42 enables the first analog switch 60. The reference voltage 74 applied from the first analog switch 60 is measured as discussed above and compared to a theoretical voltage value in block 122. If the measured test voltage does not match the theoretical value within an acceptable window ("no" branch of decision block 124), a fault condition is set and the first analog switch 60 is disabled in block 126. The process then returns to microwave energy detection operation, where, as with the diode detector circuit 40 above, other circuitry may receive the fault condition and shut down or take other appropriate action with the UV lamp system 10.

If the measured voltage does match the theoretical value within an acceptable window ("yes" branch of decision block 124), the first analog switch 60 from the first test is disabled and the second analog switch 64 for the second test is enabled in block 128. The reference voltage 74 applied from the second analog switch 64 is measured and compared to a theoretical value in block 130. Similar to above, if the measured voltage does not match the theoretical value within an acceptable window ("no" branch of decision block 132), a fault condition is set and the second analog switch is disabled in block 134. The process then returns to microwave energy detection operation where, similar to a failure from the first test and as with the diode detector circuit 40 above, other circuitry may receive the fault condition and shut down or take other appropriate action with the UV lamp system 10. If the measured voltage matches the theoretical value within an acceptable window ("yes" branch of decision block 132) the fault condition is cleared and the second analog switch 64 is disabled in block 136. The diagnostic timer for the test circuit is then reset and loaded with a new time value in block 102 and microwave energy detection resumes in blocks 104-116.

Though the embodiments discussed above describe a system comprising two test conditions, other embodiments may intermittently employ more or less than two test conditions. Similarly, while the embodiments described above test only a resistive component 72 and a diode component 70, one or more other components of the diode detector circuit 40 may be tested alternatively or additionally. The embodiments discussed above utilize low pass filters 62, 66 to isolate the test circuit 60-66 from the diode detection circuit 40, which allow test signals at DC or low frequency AC. RF test signals may also be employed which may require isolation methods other than the use of low pass filters as discussed above.

Additionally, embodiments of the invention may also be used to detect a drift in the calibration of the microwave energy detector 30. During calibration of the UV lamp system 10, a calibration test voltage is taken across the radiation sensitive component(s) when there is no microwave energy present and is stored in a nonvolatile memory by the microcontroller 42. During subsequent operation, the microcontroller 42 will first determine if microwave energy is present. If so, the microcontroller 42 will intermittently suspend the detection of microwave energy and supply test signals as described in the embodiments above. If no microwave energy is present, the microcontroller 42 compares the voltage measured across the radiation sensitive component(s) with the calibration test value that was saved during the calibration to determine if there is a drift in the calibration.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicants' general inventive concept.

What is claimed is:

1. A detector for an ultraviolet lamp system of the type having a microwave energy generator for generating microwave energy, the detector comprising:

a first circuit configured to detect the microwave energy, said first circuit including at least one radiation sensitive component capable of failing upon exposure to an excessive amount of microwave energy; and a second circuit coupled to said first circuit and configured to intermittently test whether said radiation sensitive component has failed.

2. The detector of claim 1, wherein said second circuit is configured to supply a known signal to said first circuit to test said radiation sensitive component.

3. The detector of claim 2, wherein the known signal is an RF signal.

4. The detector of claim 2, wherein the known signal is a low frequency AC signal.

5. The detector of claim 2, wherein said second circuit is further configured to temporarily suspend the detection of the microwave energy by said first circuit to test said radiation sensitive component.

6. The detector of claim 5, wherein the known signal is a DC signal.

7. The detector of claim 1, wherein said radiation sensitive component is a detector diode and said second circuit is configured to detect an open or short circuit across said detector diode.

8. The detector of claim 1, wherein said radiation sensitive component is a resistor and said second circuit is configured to detect an open or short circuit across said resistor.

9. An ultraviolet lamp system for irradiating a substrate, comprising:

a microwave energy generator;

an electrodeless lamp configured to emit ultraviolet light when excited by microwave energy generated from said microwave energy generator; and a detector for detecting an excessive amount of microwave energy, the detector including:

i. a first circuit configured to detect microwave energy, said first circuit including at least one radiation sensitive component capable of failing upon exposure to the excessive amount of microwave energy; and ii. a second circuit coupled to said first circuit and configured to intermittently test whether said radiation sensitive component has failed.

10. The ultraviolet lamp system of claim 9 wherein said microwave energy generator is a magnetron.

11. The ultraviolet lamp system of claim 9, wherein said second circuit is configured to supply a known signal to said first circuit to test said radiation sensitive component.

12. The ultraviolet lamp system of claim 11, wherein the known signal is an RF signal.

13. The ultraviolet lamp system of claim 11, wherein the known signal is a low frequency AC signal.

14. The ultraviolet lamp system of claim 11, wherein said second circuit is further configured to temporarily suspend the detection of the microwave energy by said first circuit to test said radiation sensitive component.

15. The ultraviolet lamp system of claim 14, wherein the known value is a DC signal.

16. The ultraviolet lamp system of claim 9, wherein said radiation sensitive component is a detector diode and said second circuit is configured to detect an open or short circuit across said detector diode.

17. The ultraviolet lamp system of claim 9, wherein said radiation sensitive component is a resistor and said second circuit is configured to detect an open or short circuit across said resistor.

18. A method for monitoring microwave energy emitted from an ultraviolet lamp system, the method comprising:

monitoring the microwave energy through a first circuit including at least one radiation sensitive component capable of failing upon exposure to an excessive amount of microwave energy; and testing the radiation sensitive component to determine whether the radiation sensitive component has failed.

19. The method of claim 18, wherein testing the radiation sensitive component comprises:

intermittently supplying a known signal to the first circuit to detect a failure of the radiation sensitive component.

20. The method of claim 19, wherein intermittently supplying the known signal further comprises:

intermittently supplying an RF signal.

21. The method of claim 19, wherein testing the radiation sensitive component further comprises:

intermittently suspending the monitoring of the microwave energy by the first circuit, supplying the known signal during the suspension of the monitoring of the microwave energy.

22. The method of claim 21, wherein the intermittently supplying the known signal further comprises:

intermittently supplying a DC signal.

23. The method of claim 18, wherein testing the radiation sensitive component comprises:

detecting an open or short circuit across a detector diode.

24. The method of claim 18, wherein testing the radiation sensitive component comprises:

detecting an open or short circuit across a resistor.

25. The method of claim 18 further comprising:

storing a calibration test value of the radiation sensitive component when no microwave energy is present.

26. The method of claim 25, wherein testing the radiation sensitive component comprises:

detecting the presence of microwave energy;

in response to the presence of microwave energy, intermittently supplying a known signal to the first circuit to detect a failure of the radiation sensitive component; and in response to the absence of microwave energy, comparing a signal from the radiation sensitive component to the calibration test value to detect a drift in calibration.

* * * * *